US011977194B2

United States Patent
Griffin et al.

(10) Patent No.: US 11,977,194 B2
(45) Date of Patent: May 7, 2024

(54) PRINTED FILM ELECTROSTATIC CONCENTRATION FOR RADON DETECTION

(71) Applicant: National Research Council of Canada, Ottawa (CA)

(72) Inventors: Ryan Hunter Griffin, Ottawa (CA); Neil Graddage, Swansea (GB)

(73) Assignee: National Research Council of Canada

( * ) Notice: Subject to any disclaimer, the term of this patent is extended or adjusted under 35 U.S.C. 154(b) by 495 days.

(21) Appl. No.: 17/288,205

(22) PCT Filed: Oct. 25, 2019

(86) PCT No.: PCT/IB2019/059187
§ 371 (c)(1),
(2) Date: Apr. 23, 2021

(87) PCT Pub. No.: WO2020/084594
PCT Pub. Date: Apr. 30, 2020

(65) Prior Publication Data
US 2021/0396895 A1    Dec. 23, 2021

Related U.S. Application Data

(60) Provisional application No. 62/750,511, filed on Oct. 25, 2018.

(51) Int. Cl.
*G01T 7/06*    (2006.01)
*H05K 1/02*    (2006.01)
(Continued)

(52) U.S. Cl.
CPC ............ *G01T 7/06* (2013.01); *H05K 1/0283* (2013.01); *H05K 1/0393* (2013.01); *H05K 1/092* (2013.01);
(Continued)

(58) Field of Classification Search
None
See application file for complete search history.

(56) References Cited

U.S. PATENT DOCUMENTS 3,681,772 A    8/1972   Ingerson
4,652,318 A    3/1987   Masuda et al.
(Continued)

FOREIGN PATENT DOCUMENTS

CN    212206776 U  * 12/2020
EP      1863122 A1    12/2007
JP    2002107458       4/2002

OTHER PUBLICATIONS

R.H. Griffin, H. Le, D.T. Jack and N. G. Tarr, AlphaRAM: An Alpha Particle Detecting MOS IC for Radon Monitoring, Department of Electronics, Carleton University, Ottawa, Canada IEEE, 2008; 73-76.

(Continued)

*Primary Examiner* — Michael Lebentritt
(74) *Attorney, Agent, or Firm* — Brett Reynolds

(57) ABSTRACT

An electrostatic concentrator for use in radon detection, comprising of a plastic sheet having conductive electrodes patterned onto the surface. The sheet is patterned and cut in such a way that it can be assembled into a three-dimensional shape (e.g. a cone), such that when a voltage is applied to the electrodes an electrostatic field is created for propelling radon progeny towards a sensor on which it can be detected.

20 Claims, 7 Drawing Sheets

(51) Int. Cl.
  H05K 1/03  (2006.01)
  H05K 1/09  (2006.01)
  H05K 3/00  (2006.01)
  H05K 3/12  (2006.01)

(52) U.S. Cl.
  CPC ............. *H05K 3/0044* (2013.01); *H05K 3/12* (2013.01); *H05K 1/0306* (2013.01); *H05K 1/032* (2013.01)

(56) References Cited

U.S. PATENT DOCUMENTS

| | | | |
|---|---|---|---|
| 4,675,690 | A | 6/1987 | Hoffman |
| 5,029,248 | A | 7/1991 | Miyake |
| 6,346,709 | B1 * | 2/2002 | Kronenberg ............ G01T 1/142 250/375 |
| 6,384,799 | B1 | 5/2002 | Otomo et al. |
| 7,038,636 | B2 | 5/2006 | Larouche et al. |
| 7,944,404 | B2 | 5/2011 | Yun et al. |
| 2004/0232345 | A1 * | 11/2004 | Jagam .................... G01T 1/178 250/370.02 |
| 2010/0095508 | A1 | 4/2010 | Wahlen et al. |
| 2018/0056354 | A1 | 3/2018 | Takata et al. |

OTHER PUBLICATIONS

R.H. Griffin, A. Kochermin, N.G. Tarr, H. McIntosh, H. Ding, J. Weber, R. Falcomer, A sensitive, fast-responding passive electrostatic radon monitor, Department of Electronics, Carleton University, Ottawa, Canada, IEEE, 2011; 4 pages.

R. H. Griffin, H. Le, D.T. Jack, A. Kochermin, N.G. Tarr, Radon Monitor using Custom Alpha-Detecting MOS IC, Department of Electronics, Carleton University, Ottawa, Canada, IEEE Sensors 2008 Conference, 2008; 906-909.

Hiroshi Miyake, Keiji Oda, Masami Michijima, Portable and High-Sensitive Apparatus for Measurement of Environmental Radon Using CR-39 Track Detector, Department of Nuclear Engineering, Kobe University of Mercantile Marine, Kobe 658 JAPAN, 1987; 607-610.

Alexander J. H. Ross, Ryan H. Griffin, N. Garry Tarr, Radon Monitor Using Alpha-Detecting CMOS IC; Department of Electronics, Carleton University, Ottawa, Canada, IEEE, 2016; 5 pages.

Griffin R.H., "Resources," in IEEE Spectrum, vol. 51, No. 6, pp. 21-22, Jun. 2014, doi: 10.1109/MSPEC.2014.6821608.

Extended European Search Report dated May 20, 2022.

* cited by examiner

PRINTED FILM ELECTROSTATIC CONCENTRATION FOR RADON DETECTION

CROSS-REFERENCE TO RELATED APPLICATIONS

This application is a national phase entry of International Patent Application PCT/IB2019/0591871 filed Oct. 25, 2019 which claims the benefit of U.S. Provisional Patent Application No. 62/750,511 on Oct. 25, 2018.

BACKGROUND OF THE INVENTION

1. Field of the Invention

The present invention is directed to radon detectors, and more particularly to a printed film based electrostatic concentrator for radon detection using an electronic sensor.

2. Description of the Related Art

Radon is a naturally occurring clear, colourless, odorless, tasteless, radioactive noble gas that is produced during the radioactive decay sequence of uranium ($^{238}U$). Alpha particles emitted during radon or progeny decay can be very damaging to living tissue. Radon decay products tend to be charged, which results in the progeny (polonium-218) attaching readily to dust, thereby increasing the likelihood of inhalation. If inhaled, radon and radon progeny pose a significant risk to lung tissue, and long-term exposure may lead to lung cancer. Radon exposure is the second leading cause of lung cancer, second only to smoking. Consequently, there exists a need for a cost-effective radon monitor that can be widely deployed.

A variety of radon detectors exist on the market, most of which detect radon indirectly by sensing radioactive decay. The most common and inexpensive detectors are track-etch detectors, which are typically limited to one-time use for measuring a long-term average radon concentration. Track-etch detectors require specialized equipment for readout in a laboratory setting.

Another class of radon detector is of the "direct reading" variety, which operate continuously and report the results directly to the user. These direct systems operate by concentrating radon, and/or radon progeny, onto/near a sensor for detecting radioactive decay. Concentration can be achieved in one of two ways: "active concentration" uses calibrated fans to move a known volume of air through a filter, from the surface of which radioactive decay is detected, or "passive concentration" which uses electrostatic fields to concentrate charged radon progeny directly onto a sensor. In general, systems employing active concentration are fast, require calibration, consume significant power, and are expensive. Systems employing passive concentration are slower, require little to no maintenance, require less power to operate, and are more affordable than systems using active concentration.

One prior art electrostatic concentrator for radon detection is built from a polyethylene cone having a conductive inside surface and separated into two sections to create a strong electrostatic field inside the cone (see R. H. Griffin, H. Le, D. T. Jack, A. Kochermin, and N. G. Tarr, "Radon monitor using custom alpha-detecting MOS IC," in Sensors, 2008 IEEE, October 2008, pp. 906-909).

Passive electrostatic radon detectors are well suited to consumers due to their ease of use, direct reporting, and low-cost relative to "active" detectors. Nonetheless, even lower cost passive direct reading radon detectors are not inexpensive and are of limited functionality, which has led to limited public acceptance.

SUMMARY OF THE INVENTION

It is an aspect of the present invention to provide an electrostatic concentrator for radon detection that overcomes at least some of the disadvantages of prior art electrostatic concentrators.

In one aspect, an electrostatic concentrator is set forth for use in radon detection, comprising a plastic sheet having conductive electrodes patterned onto the surface. The sheet is patterned and cut in such a way that it can be assembled into a three-dimensional shape (e.g. a cone), such that when a voltage is applied to the electrodes an electrostatic field is created for propelling radon progeny towards a sensor on which it can be detected.

According to another aspect, low-cost printed electronics are used to replace polyethylene cones, conductive coatings and metal structures of prior art electrostatic concentrators. The use of printers allows electrodes to be printed using inexpensive conductive carbon inks on thin substrates, such as plastic sheets/films, for easy assembly by a manufacturer or end user. This also reduces manufacturing costs by minimizing the materials required and leverages the enormous speed and throughput of printing. Minimizing weight also lessens transport and shipping costs, particularly having regard to the potential for shipping and distributing flat packed consumer radon detectors that can be assembled by the end user.

The above aspects can be attained by an electrostatic concentrator for use in radon detection by a sensor, comprising: a flexible substrate formable into a shape and having at least one opening for air to enter; a shape retaining mechanism for retaining the shape of the flexible substrate when formed into said shape; and a conductive pattern on said flexible substrate forming at least one electrode, such that when the flexible substrate is positioned close to the sensor and voltage is applied to the electrode an electrostatic field is created for propelling radon progeny toward the sensor.

Another aspect can be attained by a method of manufacturing an electrostatic concentrator for use in radon detection, comprising: printing at least one electrode on a flexible substrate; cutting the flexible substrate to form a blank; and assembling the blank to form a dome portion and a cone portion.

A further aspect can be attained by a method of manufacturing a blank for assembly into an electrostatic concentrator for use in radon detection, comprising: printing top and bottom electrodes on a flexible substrate; and cutting said flexible substrate to form a shape having at least one opening and a plurality of tabs and slots.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1:
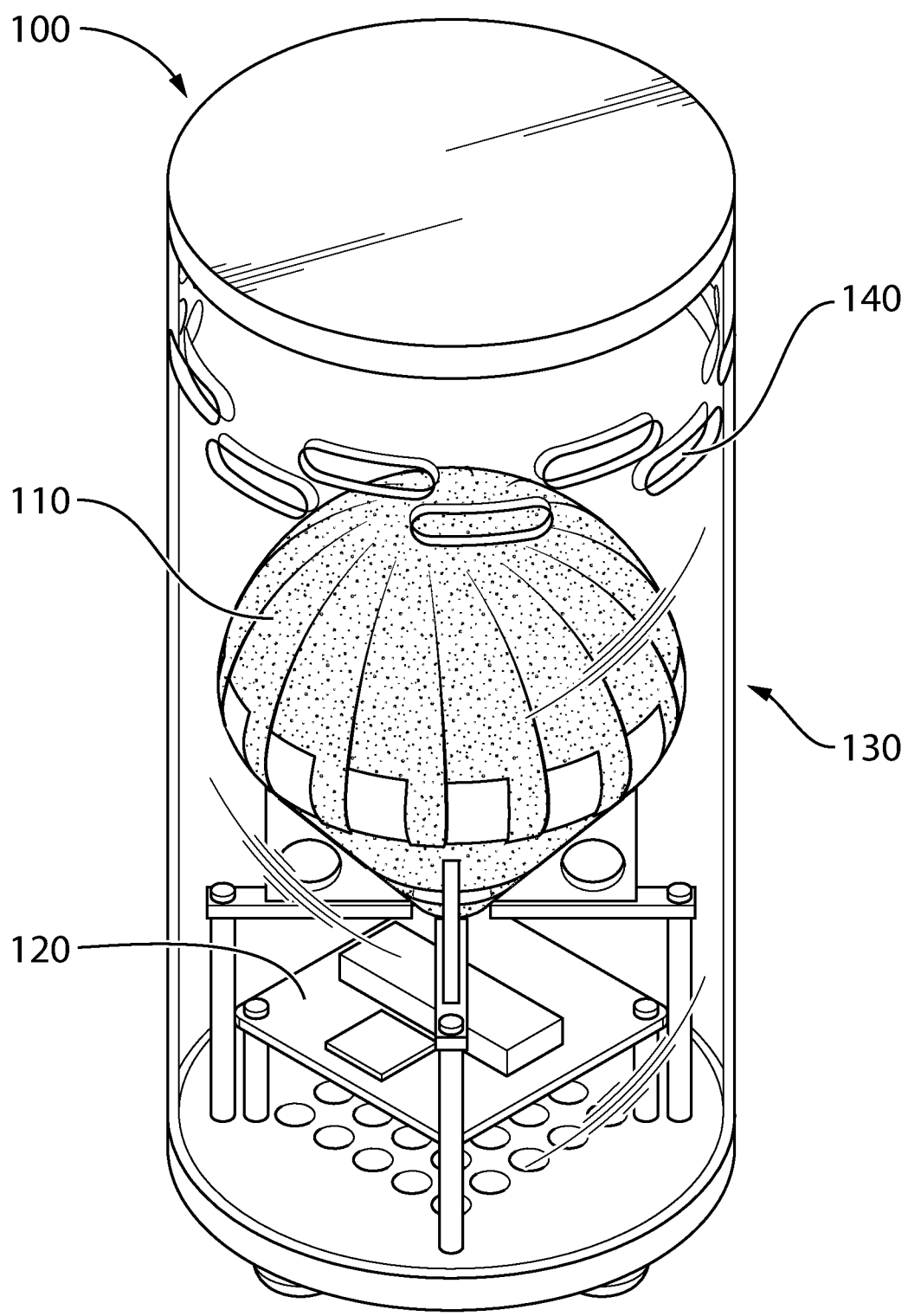
FIG. 1 is a perspective view of an exemplary passive direct reading radon detector incorporating an electrostatic concentrator according to an embodiment of the invention.

With reference to FIG. 1, a passive concentrator based direct reading radon detector 100 is shown comprising an electrostatic concentrator 110 positioned over a sensor such as an alpha particle-detecting integrated circuit (IC) 120. The concentrator 110 and IC 120 are enclosed within a cylindrical protective housing 130 having apertures 140 for receiving ambient air. A microcontroller (not shown) drives the IC 120 and transmits data, as is known in the art.

As discussed above, passive direct reading radon detectors such as detector 100 measure radon levels by detecting radioactive decay, such as alpha particles emitted during the decay of radon or its progeny. However, since alpha particles travel at most a few centimeters in air, radon or its progeny must be brought close to the alpha-detecting IC 120. Therefore, electrostatic concentrator 110 is used to concentrate charged radon progeny, polonium-218, onto the surface of the IC 120. As discussed in greater detail below, electrostatic concentrator 110 is preferably fabricated from a thin flexible substrate, such as a plastic sheet, onto which at least one electrode is printed using conductive material such as carbon ink. Alternatively, other conductive material may be used, such as silver, conductive polymers or conductive paint. The flexible substrate is cut to form a top dome portion and bottom body portion, as described in greater detail below, and a shape retaining mechanism is provided for retaining the shape of the electrostatic concentrator 110 upon assembly. In one embodiment the shape retaining mechanism comprises tabs and slots and/or adhesives. The flexible substrate is cut via at least one of a mechanical (e.g. die cut), optical (e.g. laser cut), thermal, or water based cutting method.

Figure 2A:
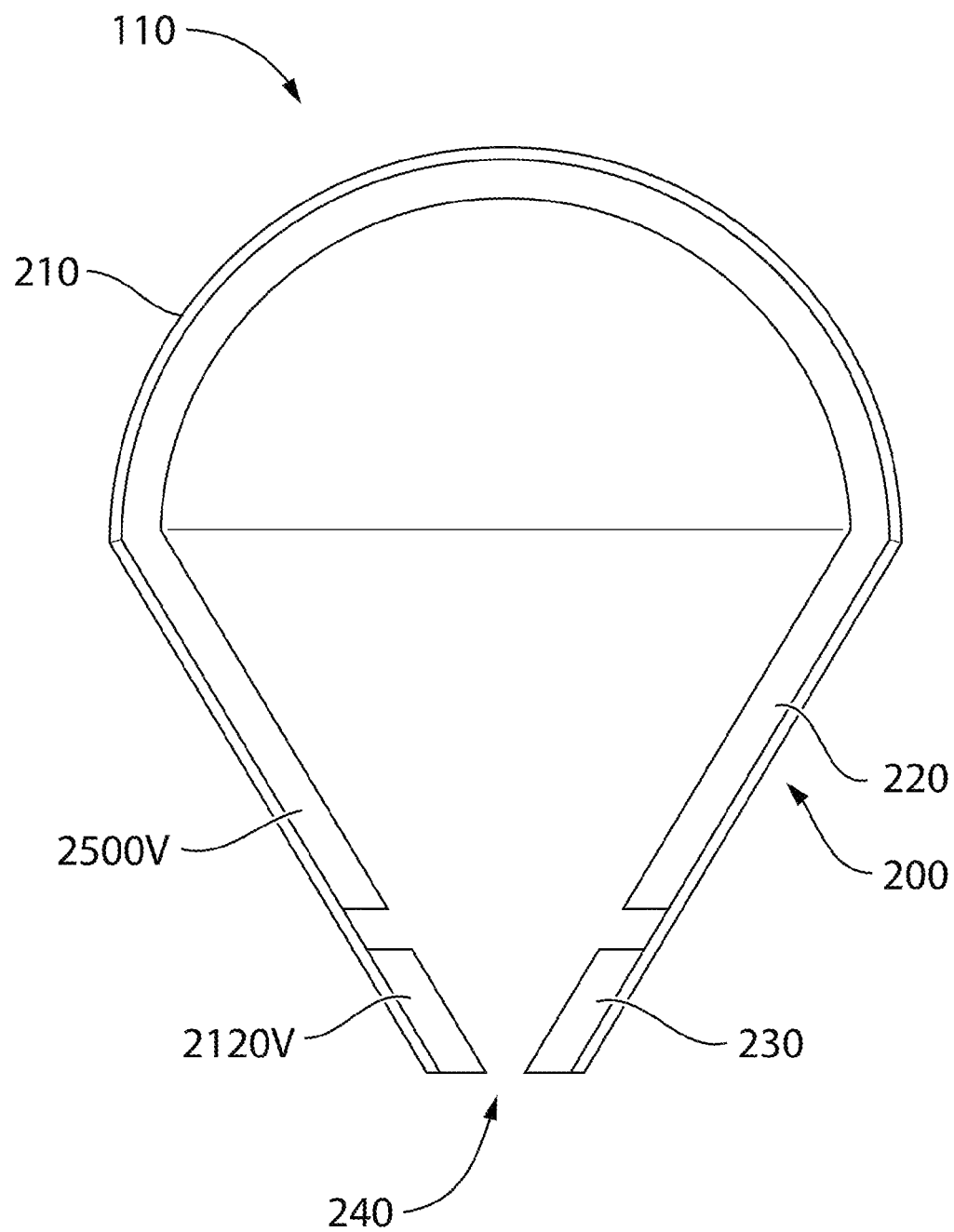
FIG. 2A is a schematic representation of a cross section through the electrostatic concentrator depicted in FIG. 1.
Figure 2B:
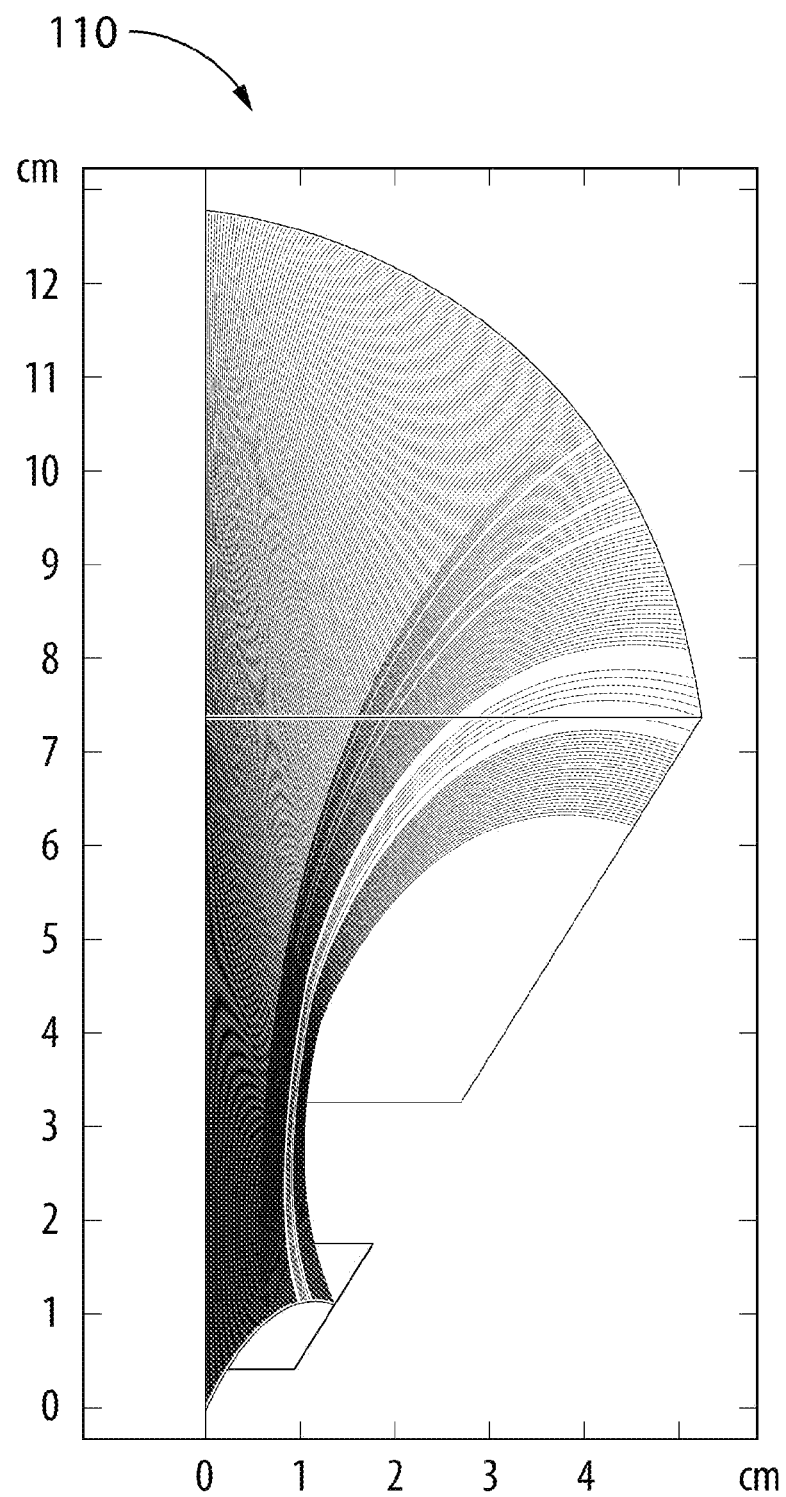
FIG. 2B is a schematic representation of an electric field distribution within the electrostatic concentrator of FIG. 2A.

FIG. 2A is a schematic representation of a cross section through the electrostatic concentrator 110 of FIG. 1. When assembled, the electrostatic concentrator 110 forms a body portion 200 and a dome portion 210. One or both of the body portion 200 and dome portion 210 may include one or more openings (not shown) for air to enter the concentrator. Top and bottom electrodes 220 and 230 are fabricated from conductive carbon ink (or other suitable conductor) that separates the electrostatic concentrator 110 into two sections to create a strong sweep field inside the body portion, such that when voltage is applied an electrostatic field is created for propelling radon progeny toward opening 240, as shown in FIG. 2B. Although the exemplary concentrator comprises a hemi-sphere (dome) and a body portion, other shapes are contemplated. For example, the body portion may be conical or in the shape of a funnel (as illustrated) or may be cylindrical. Also, the body portion may be dispensed with entirely, leaving only the dome portion or a box shape with the IC 120 positioned at the bottom thereof. An opening 240 is provided at the bottom of the electrostatic concentrator 110 for deposition of the progeny across the IC 120. In one embodiment, IC 120 may be disposed inside the concentrator 110. A potentials of 2500 V and 2120 V are applied to the top and bottom electrodes, respectively, for electrostatically concentrating the radon progeny onto the surface of IC 120, which is held at ground potential.

Figure 3:
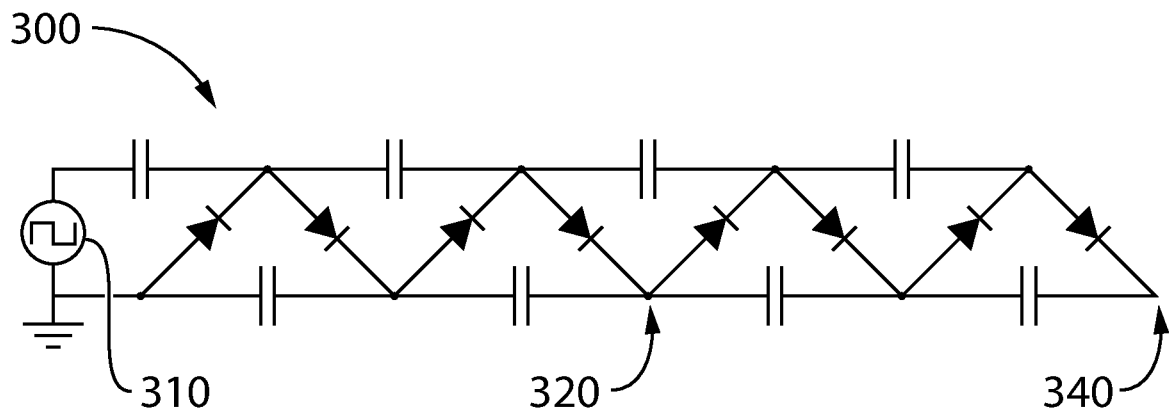
FIG. 3 is a schematic diagram of a charge pump for creating an electrostatic field within the electrostatic concentrator depicted in FIGS. 1 and 2A.

The 2500 V and 2120 V potentials may be generated by a Cockcroft-Walton charge pump 300, such as shown in FIG. 3, which utilizes a series of capacitors and diodes to convert a 5 V peak-to-peak square wave from a timer 310 into the 2500 V DC voltage connected to the top electrode 220 at connection 340 and the 2120 V DC voltage connected to the bottom electrode 230 at connection 320. Although the exemplary embodiment uses voltage values of 2500 V and 2120 V and the IC 120 at ground potential, other values may be used. Also, in one embodiment a transformer may be used to achieve the first step-up in voltage.

Figure 4:
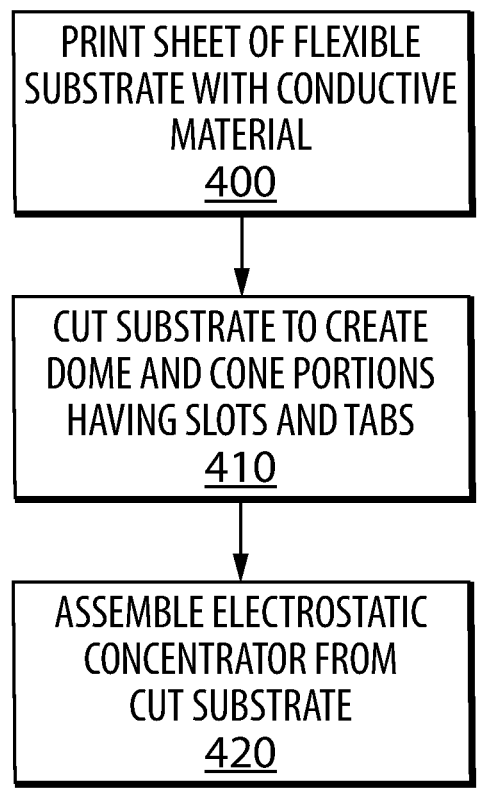
FIG. 4 is a flowchart of a method for manufacturing the electrostatic concentrator depicted in FIGS. 1 and 2A.
Figure 6:
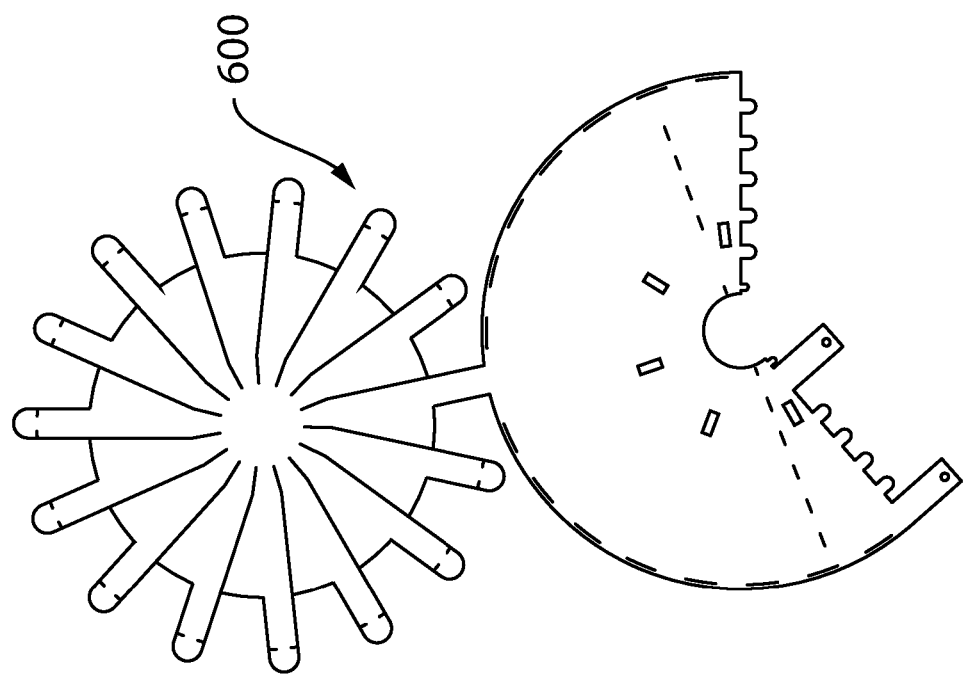
FIG. 6 shows a pattern for cutting the plastic sheet of FIG. 5.
Figure 5:
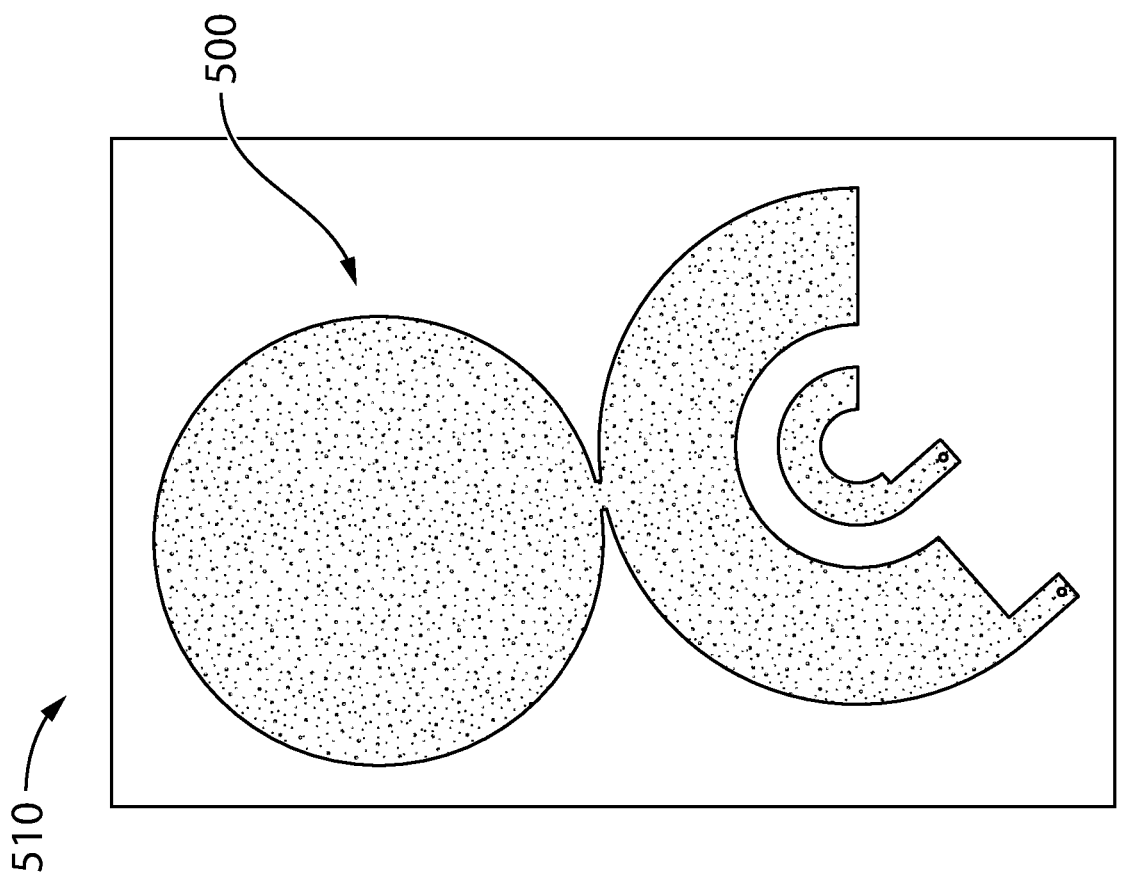
FIG. 5 is an illustration of a sheet of plastic on which a pattern of conductive ink is printed, according to an embodiment of the invention.
Figure 7:
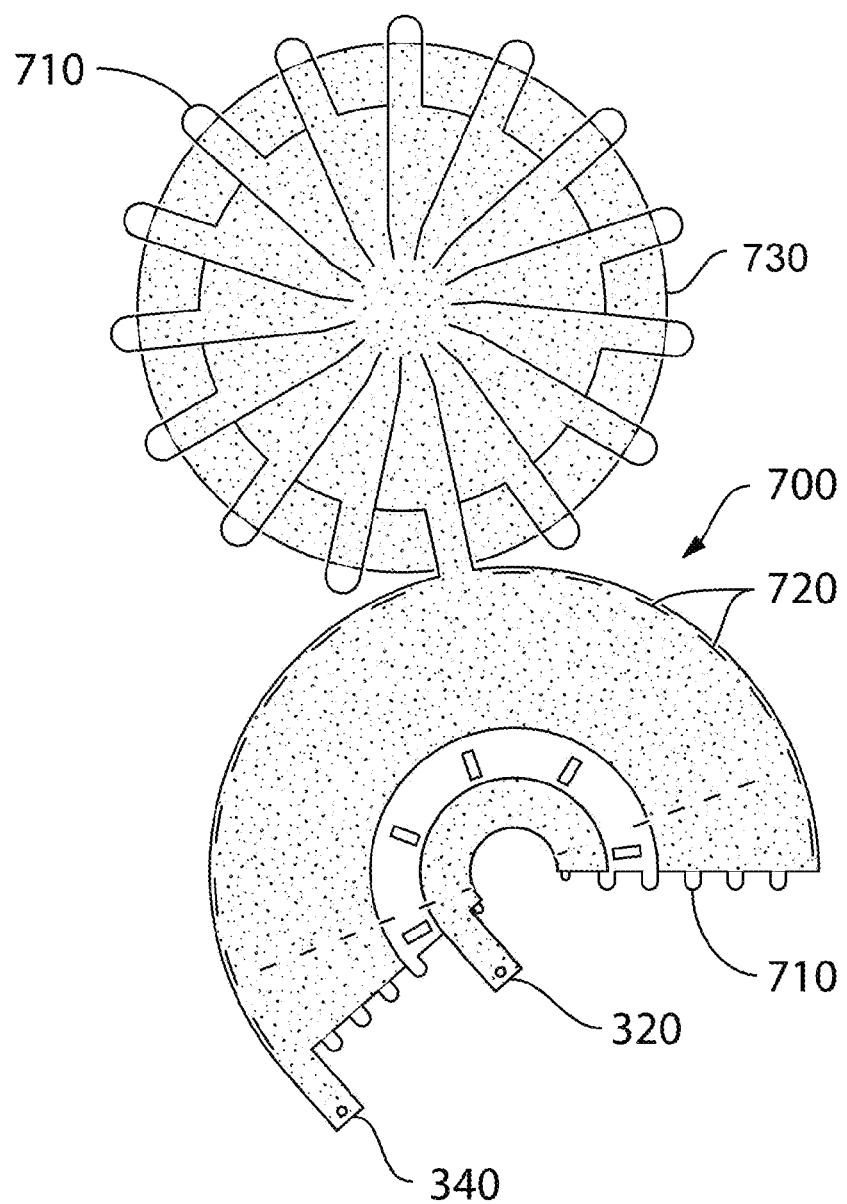
FIG. 7 shows the electrostatic concentrator of FIGS. 1 and 2A in an unassembled state following cutting of the sheet of plastic of FIG. 5 according to the pattern of FIG. 6.

According to another aspect of the invention, the electrostatic concentrator of FIGS. 1 and 2A may be manufactured according to the exemplary method shown in FIG. 4. At step 400, a conductive pattern 500, preferably formed of ink, is printed on to the flexible substrate which, according to an exemplary embodiment is a sheet of plastic 510, as shown in FIG. 5. Plastic sheet 510 can, for example, be manufactured from polyethylene terephthalate, polyimide, polypropylene, etc. Next, at step 410, the sheet 510 is cut (e.g. laser cut, die cut, etc.) according to the pattern 600 shown in FIG. 6, to create a blank 700 having a disc shaped portion (assembled to form a dome) connected to an arcuate portion (assembled to form a cone), both of which include a plurality of tabs 710 and slots 720, as shown in FIG. 7, although, as discussed above the plurality of tabs 710 and slots 720 may in some embodiments be replaced by or supplemented by adhesives or other shape retaining mechanism (e.g. a limited number of tabs/slots may be incorporated for initial assembly in order to hold the desired shape of the electrostatic concentrator while adhesive cures are applied).

Figure 8:
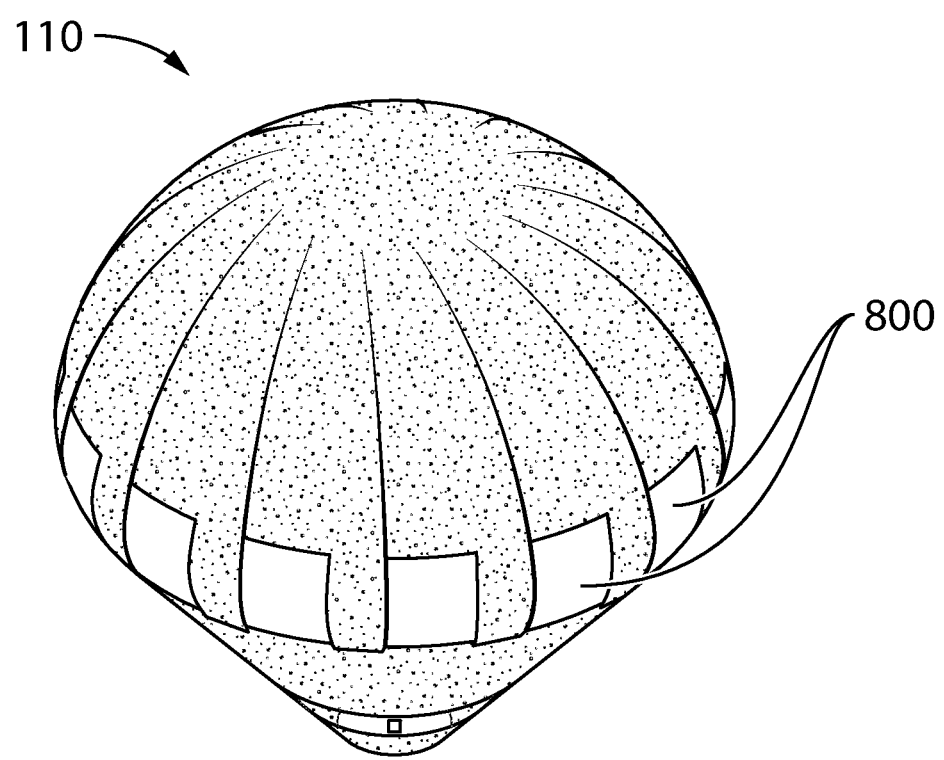
FIG. 8 shows the electrostatic concentrator of FIGS. 1 and 2A assembled according to the method of FIG. 4.

The blank 700 is then assembled, at step 420, in the style of origami, to form the final assembled electrostatic concentrator 110, as shown in FIG. 8 (i.e. the blank 700 is formable into the shape of the electrostatic concentrator 110). Specifically, tabs 710 circumscribing the dome portion of the blank 700 are inserted in corresponding slots 720 circumscribing the top of the cone portion 200 of the blank. Likewise, tabs 710 along the edges of the cone portion 200 of the blank are inserted in corresponding slots extending radially across the cone portion. Radial slots 720 in the disc shaped dome portion allow the printed plastic to fold radially during assembly so as to create the domed top 210 while also creating openings 800 for the ingress of air, as shown in FIG. 8. Additional tabs extend from the top and bottom electrodes for connection to the charge pump 300, at 320 and 340.

The present invention has been described with respect to the exemplary embodiment shown in the Figures. However, a person of ordinary skill in the art may conceive of alternatives and variations. For example, it is contemplated that the natural rebound of the plastic may be used to form the concentrator once the flat system is unpacked (e.g. the dome can be flattened for delivery and then rebound to the domed shape once the concentrator is unpacked). Also, whereas the embodiment described above incorporates top and bottom electrodes, it is contemplated that a single or more than two electrodes may be utilized as an alternative. For the single electrode embodiment, it is contemplated that the electrode can be printed on one of either the body portion 200 and a dome portion 210, with a bottom electrode disposed on a printed circuit board (PCB) to which IC 120 is mounted. In other embodiments, whether single electrode or multi-electrode, the IC 120 can function as an electrode.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An electrostatic concentrator for use in radon detection by a sensor, comprising:
    a flexible substrate in the form of a plastic film formable into a shape and having at least one opening for air to enter;
    a shape retaining mechanism for retaining the shape of the flexible substrate when formed into said shape; and
    a conductive pattern forming at least one electrode on the flexible substrate, such that when the flexible substrate is positioned close to the sensor and voltage is applied to the electrode an electrostatic field is created for propelling radon progeny toward the sensor.

2. The electrostatic concentrator of claim 1, wherein said flexible substrate fabricated from one of polyethylene terephthalate, polyimide and polypropylene.

3. The electrostatic concentrator of claim 1, wherein said shape comprises a dome portion and a cone portion.

4. The electrostatic concentrator of claim 3, wherein said at least one electrode comprises a top electrode on said dome portion and a bottom electrode on said cone portion.

5. The electrostatic concentrator of claim 4, wherein said shape retaining mechanism comprises at least one of: adhesive; and a plurality of tabs insertable into a corresponding plurality of slots in said flexible substrate.

6. The electrostatic concentrator of claim 4, wherein a first one of said plurality of tabs extends from the top electrode for receiving a first voltage and a second one of said plurality of tabs extends from the bottom electrode for receiving a second voltage for creating said electrostatic field.

7. A method of manufacturing an electrostatic concentrator for use in radon detection, comprising:
    printing at least one electrode on a flexible substrate;
    cutting said flexible substrate to form a blank; and
    assembling said blank to form a dome portion and a cone portion.

8. The method of claim 7, wherein said flexible substrate comprises a plastic film.

9. The method of claim 7, wherein said blank is cut so as to create a plurality of tabs and slots, a first one of said plurality of tabs extending from a top electrode for receiving a first voltage and a second one of said plurality of tabs extending from a bottom electrode for receiving a second voltage for creating an electrostatic field.

10. The method of claim 7, wherein said flexible substrate is cut via at least one of a mechanical, optical, thermal, or water based cutting method.

11. The method of claim 9, wherein said blank comprises a disc shaped portion connected to an arcuate portion that, when assembled, comprise said dome portion and cone portion, respectively.

12. The method of claim 11, wherein respective ones of said plurality of tabs circumscribing said disc shaped portion are coupled with corresponding slots circumscribing said arcuate portion to form said dome portion.

13. The method of claim 11, wherein respective ones of said plurality of tabs along edges of said arcuate portion are coupled with corresponding slots extending radially across said arcuate portion to form said cone portion.

14. The method of claim 11, wherein cutting said flexible substrate includes cutting a plurality of radial slots in said disc shaped portion to allow portions of the disc shaped portion to be folded radially during assembly to create the dome portion.

15. A method of manufacturing a blank for assembly into an electrostatic concentrator for use in radon detection, comprising:
    printing top and bottom electrodes on a flexible substrate in the form of a plastic film; and
    cutting said flexible substrate to form a blank having at least one opening and a plurality of tabs and slots.

16. The method of claim 15, wherein a first one of said plurality of tabs extends from the top electrode and a second one of said plurality of tabs extends from the bottom electrode.

17. The method of claim 15, wherein the blank is separated from the flexible substrate by at least one of a mechanical, optical, thermal, or water based cutting method.

18. The method of claim 15, wherein said blank comprises a disc shaped portion connected to an arcuate portion that, when assembled, comprise a dome portion and a cone portion, respectively.

19. The method of claim 18, wherein cutting said flexible substrate includes cutting a plurality of radial slots in said disc shaped portion to allow portions of the disc shaped portion to be folded radially during assembly to create the dome portion.

20. The method of claim 15, wherein printing said at least one electrode comprises applying one of conductive ink, paint or polymer.

* * * * *